United States Patent [19]

Gillessen et al.

[11] Patent Number: 4,504,740
[45] Date of Patent: Mar. 12, 1985

[54] ARRANGEMENT WITH LIGHT-SENSITIVE COMPONENTS

[75] Inventors: Klaus Gillessen, Untergruppenbach; Peter Mischel, Heilbronn, both of Fed. Rep. of Germany; Christopher Malinowski, Bridgewater, N.J.

[73] Assignee: Telefunken Electronic GmbH, Heilbronn, Fed. Rep. of Germany

[21] Appl. No.: 436,025

[22] Filed: Oct. 22, 1985

[30] Foreign Application Priority Data

Oct. 23, 1981 [DE] Fed. Rep. of Germany ....... 3142043

[51] Int. Cl.³ .............................................. H01J 40/14
[52] U.S. Cl. .................................. 250/578; 250/211 J; 358/213
[58] Field of Search ........................... 250/578, 211 J; 358/212, 213; 357/31, 32

[56] References Cited

U.S. PATENT DOCUMENTS

| | | | |
|---|---|---|---|
| 3,697,760 | 10/1972 | Biet et al. | 250/578 |
| 4,390,791 | 6/1983 | Hatanaka et al. | 358/213 |
| 4,424,590 | 1/1984 | Ozawa | 250/578 |

Primary Examiner—David C. Nelms
Assistant Examiner—James Gatto
Attorney, Agent, or Firm—Spencer & Frank

[57] ABSTRACT

It is an object of the invention to provide an arrangement comprising several or a plurality of light-sensitive components having as few contacts as possible. According to the invention there is provided an arrangement comprising several light-sensitive components, with one rectifying component connected in series to each light-sensitive component, further comprising a lead matrix with column leads and line leads, with the mth line lead connected directly to the mth column lead and to the remaining column leads through one series connection, respectively, consisting of a light-sensitive component and a rectifying component. External contacts are attached to the line leads or column leads.

5 Claims, 2 Drawing Figures

ARRANGEMENT WITH LIGHT-SENSITIVE COMPONENTS

BACKGROUND OF THE INVENTION

The invention relates to an arrangement comprising several light-sensitive components, with one rectifying component connected in series to each light-sensitive component.

Arrangements comprising several light-sensitive components are widely used today, for example, in position sensors and photographic and video recording equipment. Photodiodes, phototransistors and photoresistors consisting of a material suitable for the desired wave range such as, for example, cadmium sulphide, silicon, indium antimonide or cadmium mercury telluride are used, for example, as light-sensitive components. A large number of light-sensitive components is required to obtain a high surface resolution. A large number of light-sensitive components necessitates a large number of leads.

DESCRIPTION OF THE PREFERRED EMBODIMENT

Figure 1:
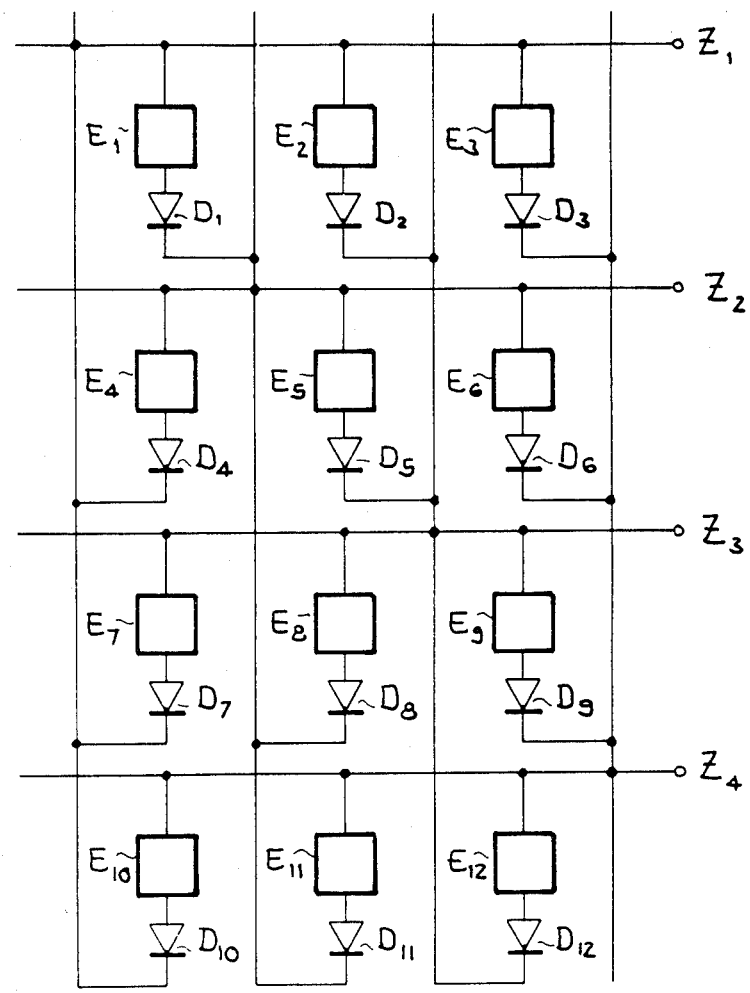
FIG. 1 shows an arrangement in accordance with the present invention comprising light-sensitive components, diodes and leads. Connected in series to each one of the light-sensitive components is one diode.

FIG. 1 shows a first embodiment of the invention comprising 12 light-sensitive components $E_1$ to $E_{12}$, 12 diodes $D_1$ to $D_{12}$ and 4 leads $Z_1$ to $Z_4$. Each component E has a diode D connected to it in series. These series connections are connected to one another and to the leads $Z_1$ to $Z_4$ in a certain way. The diodes $D_1$ to $D_{12}$ ensure that the state of each component can be detected by applying a voltage to a certain pair of leads. This voltage must be greater than the conducting state voltage of one diode and less than twice this conducting state voltage. If, for example, the diodes consist of silicon and have a conducting state voltage of 0.6–0.7 V, the voltage applied may be approximately 1 V. Table 1 indicates which pair of leads is allocated to each component.

TABLE 1

| component | positive lead | negative lead |
|---|---|---|
| $E_1$ | $Z_1$ | $Z_2$ |
| $E_2$ | $Z_1$ | $Z_3$ |
| $E_3$ | $Z_1$ | $Z_4$ |
| $E_4$ | $Z_2$ | $Z_1$ |
| $E_5$ | $Z_2$ | $Z_3$ |
| $E_6$ | $Z_2$ | $Z_4$ |
| $E_7$ | $Z_3$ | $Z_1$ |
| $E_8$ | $Z_3$ | $Z_2$ |
| $E_9$ | $Z_3$ | $Z_4$ |
| $E_{10}$ | $Z_4$ | $Z_1$ |
| $E_{11}$ | $Z_4$ | $Z_2$ |
| $E_{12}$ | $Z_4$ | $Z_3$ |

If, for example, the state of component $E_8$ is to be determined, the voltage of 1 V is applied to the pair of leads $Z_2$, $Z_3$ such that $Z_3$ is positive and $Z_2$ negative. The current flowing in this branch is then a measure of the illumination of the component $E_8$.

The arrangement shown in FIG. 1 comprises a lead matrix with four column leads and four line leads. The mth line lead is directly connected to the mth column lead, i.e., the 1st line lead to the 1st column lead, the 2nd line lead to the 2nd column lead, the 3rd line lead to the 3rd column lead and the 4th line lead to the 4th column lead. The mth line lead is connected to the remaining column leads through one series connection, respectively, each comprising a light-sensitive component with a rectifying component (diode) connected to it in series. For the 1st line lead, the remaining column leads are the 2nd, 3rd and 4th column leads; for the 2nd line lead they are the 1st, 3rd and 4th column leads; and for the 4th line lead they are the 1st, 2nd and 3rd column leads.

Figure 2:
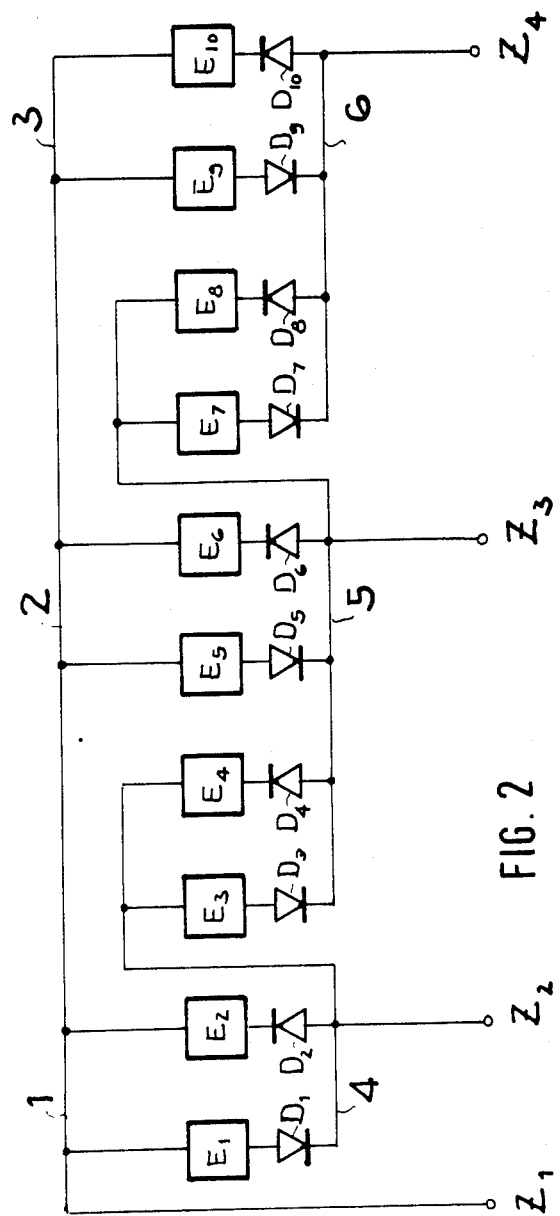
FIG. 2 shows a second embodiment of the invention comprising several parallel connections of series connections. Each parallel connection comprises two series connections, with each series connection consisting of one light-sensitive component and one rectifying component connected to one other in series.

FIG. 2 shows a second embodiment of the invention comprising 10 light-sensitive components $E_1$ to $E_{10}$, 10 diodes $D_1$ to $D_{10}$ and four leads $Z_1$ to $Z_4$. As in the first example, one component and one diode, respectively, are connected to each other in series. These series connections are connected to one another and to the leads $Z_1$ to $Z_4$ in a certain way without cross-connection. The state of each component can be detected in the same way as in the previous example by applying a voltage to a certain pair of leads. Table 2 indicates how the components $E_1$ to $E_{10}$ are allocated to the leads $Z_1$ to $Z_4$.

TABLE 2

| component | positive lead | negative lead |
|---|---|---|
| $E_1$ | $Z_1$ | $Z_2$ |
| $E_2$ | $Z_2$ | $Z_1$ |
| $E_3$ | $Z_2$ | $Z_3$ |
| $E_4$ | $Z_3$ | $Z_2$ |
| $E_5$ | $Z_1$ | $Z_3$ |
| $E_6$ | $Z_3$ | $Z_1$ |
| $E_7$ | $Z_3$ | $Z_4$ |
| $E_8$ | $Z_4$ | $Z_3$ |
| $E_9$ | $Z_1$ | $Z_4$ |
| $E_{10}$ | $Z_4$ | $Z_1$ |

If, for example, the state of the component $E_5$ is to be determined, a voltage of 1 V is applied to the pair of leads $Z_1$, $Z_3$ such that $Z_1$ is positive and $Z_3$ negative. The current flowing in this branch is then a measure of the illumination of the component $E_5$.

The embodiment shown in FIG. 2 comprises several, namely 5 parallel connections of series connections. Each parallel connection comprises two series connections, with each series connection consisting of one light-sensitive component and one rectifying component (semiconductor diode) connected in series. Three of the five parallel connections are connected to one another at their one end (1, 2, 3). Connected between the other ends (4, 5, 6) of these three parallel connections is one parallel connection, respectively, likewise consisting of the parallel connection of two series connections comprising a light-sensitive component and a diode.

The diodes of the parallel connections are connected in antiparallel relationship to one another. External contacts ($Z_2$, $Z_3$, $Z_4$) are mounted at the ends 4, 5 and 6 and at the junction of the ends 1, 2 and 3.

What is claimed is:

1. An arrangement comprising several light-sensitive components, each of which having a rectifying component connected thereto in series, further comprising a lead matrix with column leads and line leads, with the mth line lead connected directly to the mth column lead and to the reamining column leads through one series connection, respectively, consisting of a light-sensitive component and a rectifying component, and with external contacts attached to the line leads or column leads.

2. Arrangement as defined in claim 1 wherein the light-sensitive components are photodiodes, phototransistors or photoresistors.

3. Arrangement as defined in claim 1 wherein the rectifying componets are semiconductor diodes.

4. Arrangement as defined in claim 1 wherein the light-sensitive components and the rectifying components are disposed in one common semiconductor body.

5. Arrangement as defined in claim 1 wherein n leads are provided for $n^2-n$ components.

* * * * *